United States Patent
Neumann et al.

(10) Patent No.: US 10,410,760 B2
(45) Date of Patent: Sep. 10, 2019

(54) RIGID-FLEX ASSEMBLY FOR HIGH-SPEED SENSOR MODULE COMPRISING A FLEXIBLE WIRING SECTION WITH DUAL FLEXIBLE STRIPS STACKED AND ATTACHED TOGETHER

(71) Applicant: Raytheon Company, Waltham, MA (US)

(72) Inventors: Jay R. Neumann, Goleta, CA (US); Thomas F. McEwan, Ventura, CA (US); David E. Sigurdson, Goleta, CA (US); Alberto Perez, Santa Paula, CA (US); Janine F. Lambe, Goleta, CA (US); Gregory D. Tracy, Buellton, CA (US)

(73) Assignee: Raytheon Company, Waltham, MA (US)

( * ) Notice: Subject to any disclaimer, the term of this patent is extended or adjusted under 35 U.S.C. 154(b) by 372 days.

(21) Appl. No.: 15/194,427

(22) Filed: Jun. 27, 2016

(65) Prior Publication Data

US 2017/0200529 A1 Jul. 13, 2017

Related U.S. Application Data

(60) Provisional application No. 62/277,431, filed on Jan. 11, 2016.

(51) Int. Cl.
*H01B 7/04* (2006.01)
*H05K 5/00* (2006.01)
(Continued)

(52) U.S. Cl.
CPC ............... *H01B 7/04* (2013.01); *G06F 13/20* (2013.01); *H01L 27/14636* (2013.01);
(Continued)

(58) Field of Classification Search
CPC ..... H01B 7/04; H01L 27/14636; H01R 12/79; H05K 5/0069; H05K 3/4691; H05K 1/0243; H05K 1/0284; G06F 13/20; G06F 1/183
(Continued)

(56) References Cited

U.S. PATENT DOCUMENTS 4,687,695 A  8/1987  Hamby
6,541,756 B2 *  4/2003  Schulz ............... A61B 5/02427
                                                250/221
(Continued)

FOREIGN PATENT DOCUMENTS

EP       1081944 A2    3/2001
JP    2004-029652 A    1/2004
(Continued)

OTHER PUBLICATIONS

International Search Report for International Application No. PCT/US2016/061629 dated Feb. 17, 2017, 14 pages.

*Primary Examiner* — Que Tan Le

(57) ABSTRACT

A rigid-flex assembly (RFA) includes a circuit board attachable to a focal plane sensor. The RFA includes a flexible wiring section electrically coupled at opposing ends to the circuit board and to an edge connector. The flexible wiring section has a controlled separation distance or volume or vacuum gap between wiring strips for reduction of dielectric electrical loss and electrical cross talk. The flexible section has wires or traces configured to reduce the amount of copper used while optimizing signal integrity. Rigid substrates electrically couple the flexible wiring section to the connector. The RFA uses an end-launch, in-plane connection to the sensor for improved performance. A sensor module includes a housing and a sensor. An RFA is coupled to the sensor for high-speed data transfer and that optimizes signal (Continued)

integrity while providing thermal isolation via the flexible section.

26 Claims, 11 Drawing Sheets

(51) Int. Cl.
*H05K 1/02* (2006.01)
*H01R 12/79* (2011.01)
*H01L 27/146* (2006.01)
*G06F 13/20* (2006.01)
*H01P 3/08* (2006.01)
*H04N 5/225* (2006.01)
*H05K 3/46* (2006.01)
*H04M 1/02* (2006.01)

(52) U.S. Cl.
CPC .......... *H01L 27/14652* (2013.01); *H01P 3/08* (2013.01); *H01R 12/79* (2013.01); *H04M 1/0264* (2013.01); *H04N 5/2253* (2013.01); *H05K 1/0284* (2013.01); *H05K 3/4691* (2013.01); *H05K 5/0069* (2013.01); *H05K 1/0203* (2013.01); *H05K 1/0243* (2013.01); *H05K 1/0245* (2013.01); *H05K 2201/10121* (2013.01); *H05K 2201/10151* (2013.01); *H05K 2201/10189* (2013.01); *Y02D 10/14* (2018.01)

(58) Field of Classification Search
USPC .................................... 250/239, 551, 214 R
See application file for complete search history.

(56) References Cited

U.S. PATENT DOCUMENTS

| | | | |
|---|---|---|---|
| 8,183,521 B2* | 5/2012 | Quercia | G06F 3/0317 250/214 R |
| 9,518,887 B2* | 12/2016 | DeRosa | H05K 1/028 |
| 2005/0041400 A1 | 2/2005 | Berberich et al. | |
| 2007/0040626 A1 | 2/2007 | Blair et al. | |
| 2011/0304763 A1 | 12/2011 | Choi et al. | |
| 2013/0303091 A1 | 11/2013 | Lee et al. | |

FOREIGN PATENT DOCUMENTS

| | | |
|---|---|---|
| JP | 2011-204503 A | 10/2011 |
| JP | 2014-110206 A | 6/2014 |
| JP | 2014-154244 A | 8/2014 |
| KR | 20120050499 A | 5/2012 |

* cited by examiner

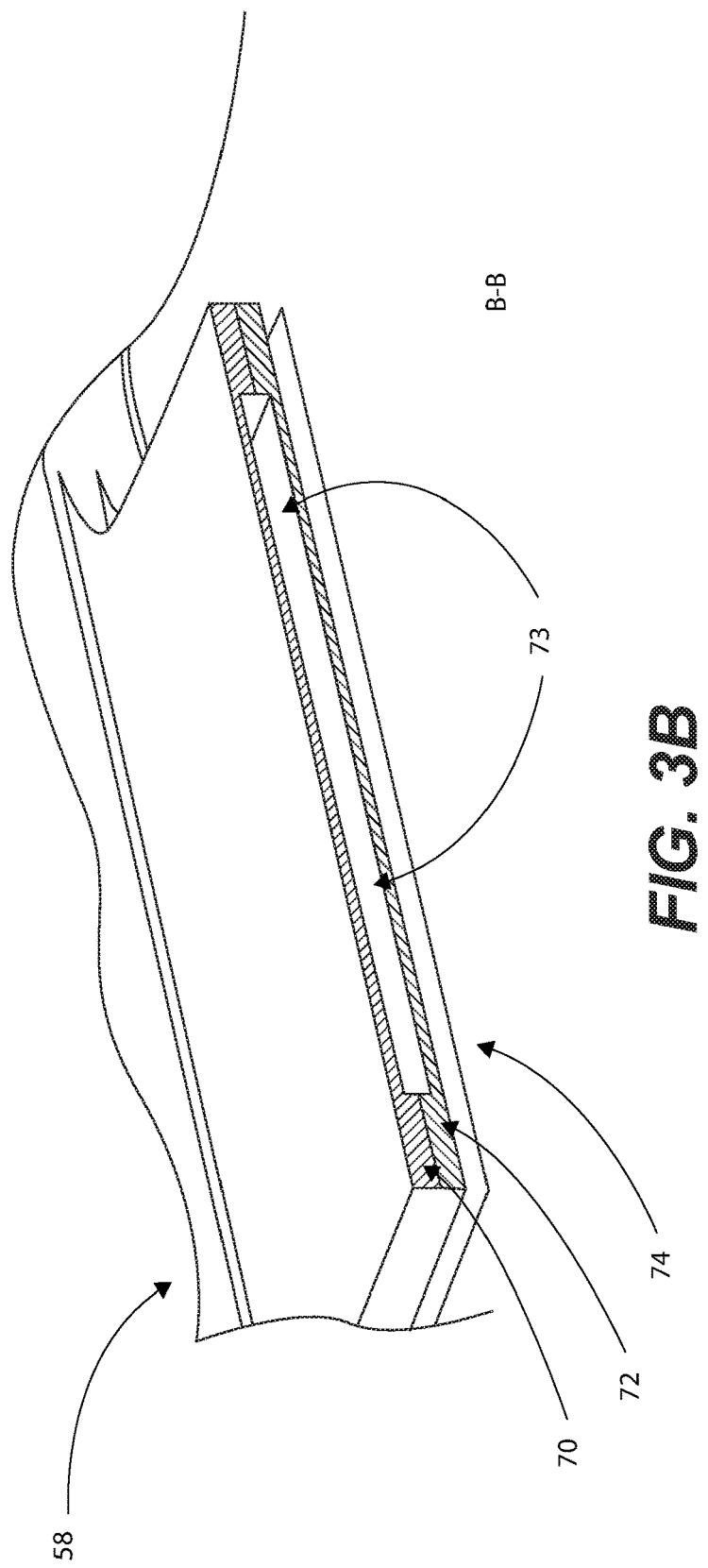

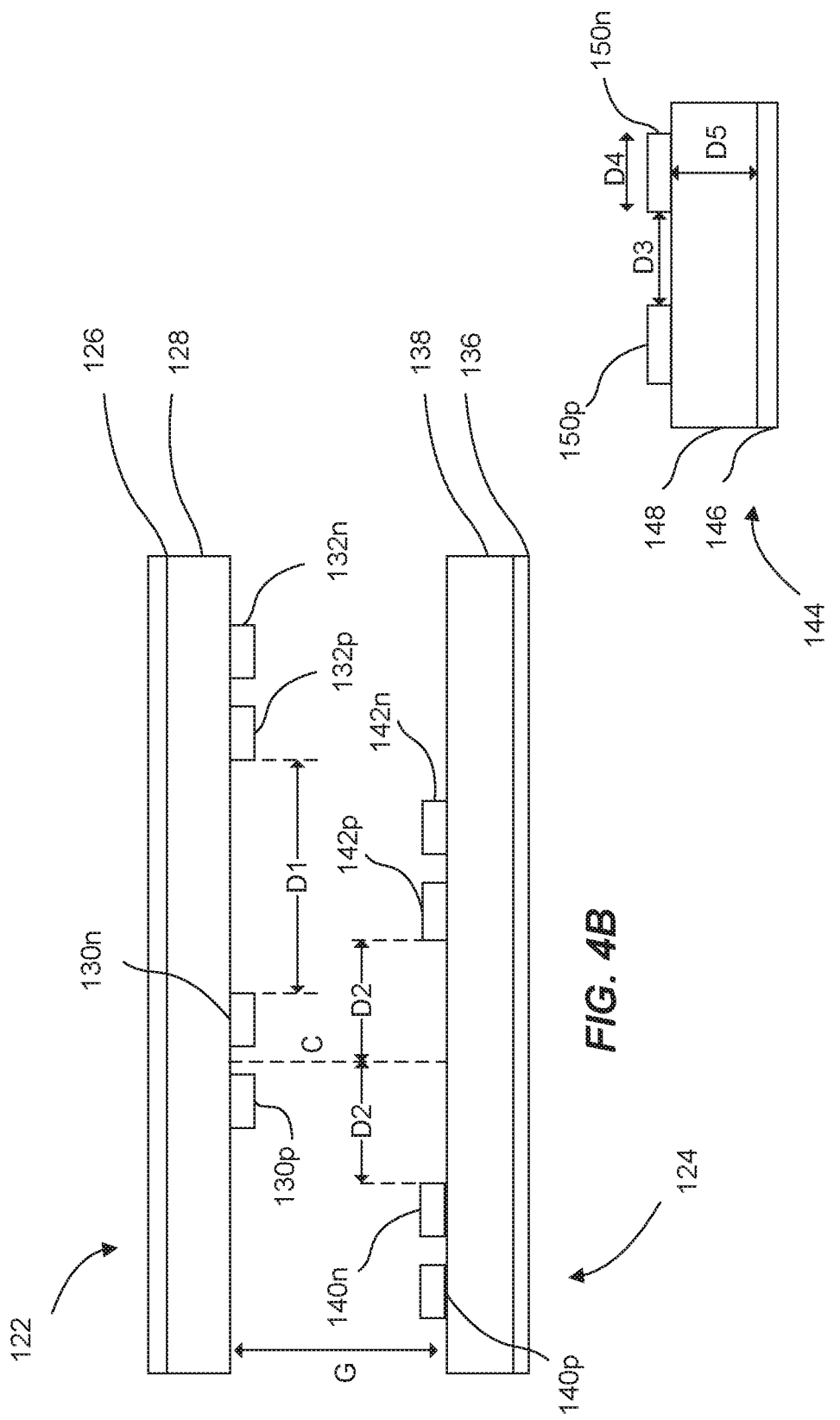

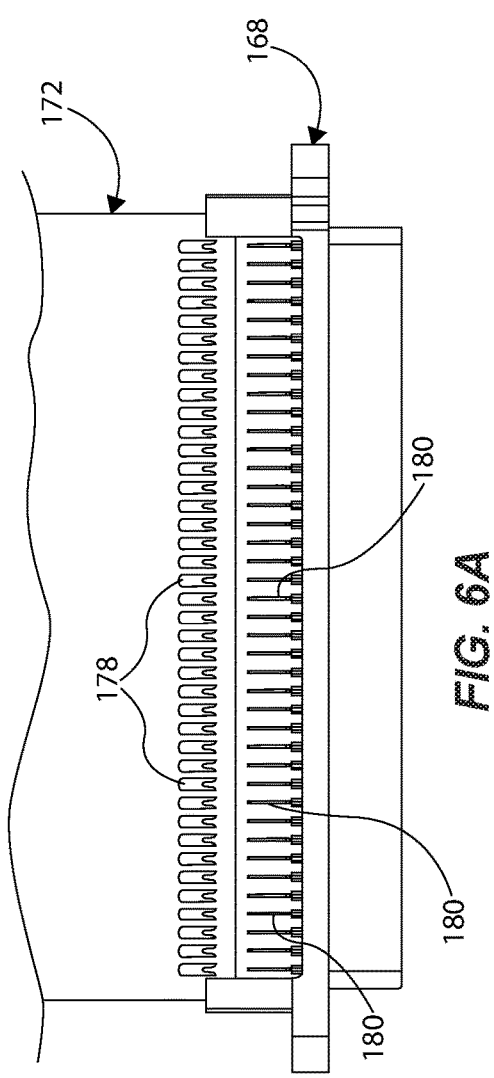
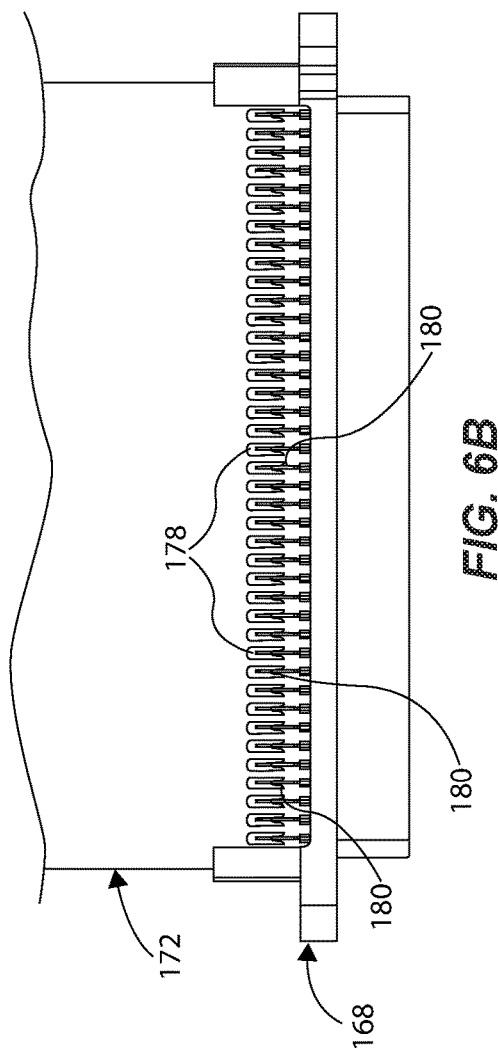

RIGID-FLEX ASSEMBLY FOR HIGH-SPEED SENSOR MODULE COMPRISING A FLEXIBLE WIRING SECTION WITH DUAL FLEXIBLE STRIPS STACKED AND ATTACHED TOGETHER

RELATED APPLICATIONS

This application claims the benefit of U.S. Provisional Patent Application Ser. No. 62/277,431, filed on Jan. 11, 2016, which is incorporated herein by reference in its entirety.

GOVERNMENT LICENSE RIGHTS

This invention was made with government support. The government has certain rights in the invention.

BACKGROUND

High-speed sensor modules typically have a sensor (such as a focal plane array module) attached to a high-speed digital readout integrated circuit (ROIC) for capturing and transferring data pertaining to images/video of objects (e.g., such as used with Visible and Infrared Focal Plane Modules). A typical ROIC can have one, two or multiple wire strips sections extending therefrom and attached to a computer system through a series of connectors (e.g., 90 degree connectors or edge connectors) for processing data transferred by the wiring strips. Moreover, ROICs in recent years have been required to operate at increased output rates an order of magnitude (greater than 2.7 Gps) while maintaining signal integrity and while providing thermal isolation of a sensor module operating at 40K or less over hundreds of thermal cycles, for example. The signal insertion loss can also be required to be at less than 7 db. In addition, ASTM 595 for NASA requirements for these sensors modules to operate continuously under a vacuum for at least five years. The above stringent requirements pose many challenges to the design and operation of a sensor module and its components, such as the wiring strips, ROICs, and connection devices and schemes. Some of the challenges include a delicate design trade-off between optimal signal integrity (e.g., the amount of connections, bend, and wire bonds) and thermal loss isolation (e.g., the volume of copper wires used and their configuration). The higher data rate reduces the required output cables and therefore improves the thermal performance.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 3B shows an isometric cross-sectional view of the flexible wiring section of the RFA of FIGS. 1 and 3A, in accordance with an example of the present disclosure.

FIG. 4B shows a schematic of a portion of a stack of an RFA, in accordance with an example of the present disclosure.

FIG. 4C shows a schematic of a portion of a stack of an RFA, in accordance with an example of the present disclosure.

FIG. 6A shows a top view of a portion of the edge connector of FIG. 5 and being disconnected from a substrate, in accordance with an example of the present disclosure.

FIG. 6B shows the top view of FIG. 6A having the substrate connected to pins of the edge connector, in accordance with an example of the present disclosure.

Figure 1:
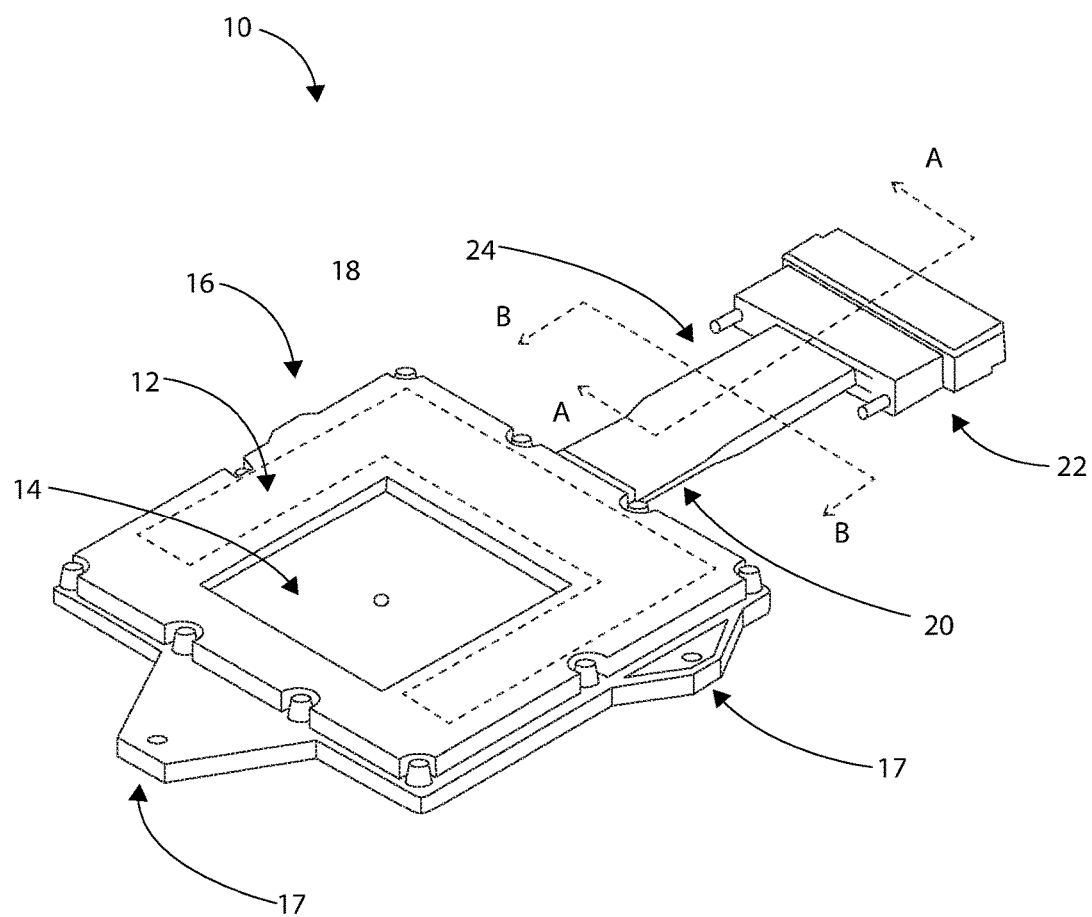
FIG. 1 shows an isometric view of a rigid-flex assembly (RFA) attachable to a sensor chip assembly, in accordance with an example of the present disclosure.

Reference will now be made to the examples illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness can in some cases depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" can be either abutting or connected. Such elements can also be near or close to each other without necessarily contacting each other. The exact degree of proximity can in some cases depend on the specific context.

An initial overview of technology examples is provided below and then specific technology examples are described in further detail later. This initial summary is intended to aid readers in understanding the technology more quickly but is not intended to identify key features or essential features of the technology nor is it intended to limit the scope of the claimed subject matter.

A rigid-flex assembly (RFA) for high-speed data transfer, in accordance with one example, is disclosed. The assembly can include an electrical component (e.g., circuit board) attachable to a sensor (such as a focal plane array). A flexible wiring section can be electrically coupled at one end to the electrical component for transferring data gathered by the sensor chip assembly. The flexibly wiring section can minimize thermal transfer and can facilitate thermal transfer (i.e., can have a thermal transfer means) for transferring heat away from the flexible wiring section (and the ROIC and sensor). In one aspect, thermal transfer can be accomplished via a controlled separation volume or void defined by area between a first flexible strip and a second flexible strip of the flexible wiring section. A plurality of rigid substrates (e.g., three substrates) can be electrically coupled to the other end of the flexible wiring section. An edge connector can be electrically coupled to the rigid substrates and attachable to a computer system for processing data gathered by the sensor chip assembly.

The flexible wiring section can have a first flexible strip that includes a first set of electrical wires or traces, and a second flexible strip that includes a second set of electrical wires or traces that oppose the first set of electrical wires within the controlled separation volume in a gas or in a vacuum. The electrical component can be a ROIC assembly for transferring data gathered from p-n junctions of a focal plane array sensor, for example.

A sensor module having an RFA for high-speed data transfer, in accordance with one example, is disclosed. The module can include a housing and a sensor module within the housing. An RFA can include an electrical circuit board or an electrical transfer substrate transferring data through a ROIC for example and electrically coupled to the sensor chip assembly. A flexible wiring section can be electrically coupled to the circuit board for transferring data from the sensor chip assembly. A rigid section can be electrically coupled to the flexible wiring section. A connector can be electrically coupled or integrated to the rigid section and attachable to a computer system for processing data gathered by the sensor chip assembly. The flexible wiring section can be capable of high-speed data transfer for optimal signal integrity and for providing a low thermal conductive/radiative path.

The flexible wiring section can have a controlled separation volume, and can be flexed (e.g., serpentine) within the housing to provide a compact sensor module). The connector can be an edge connector electrically coupled to the rigid section such that the circuit board, rigid section, and connector provide an end-launch, in-plane connection configuration for optimized signal integrity and thermal loss isolation or reduced thermal loads.

The output data speed of the sensor chip assembly (e.g., focal plane array) can be from 1 bps to greater than 2.7 Gbps. The sensor chip assembly and RFA can be configured to operate at a temperature of at least 40 Kelvins with hundreds thermal cycles, or from 373K to below 40K.

A method of manufacturing a high-speed sensor module for optimal signal integrity and isolated thermal loss, in accordance with one example, is disclosed. The method can include providing a housing and attaching a sensor module within the housing. The method can include electrically attaching a rigid-flex assembly (RFA) to the sensor chip assembly. The RFA can include an integrated circuit electrically coupled to the sensor (SCA) and a flexible wiring section electrically coupled to the circuit board for transferring data from the sensor chip assembly. The RFA can further include a rigid section electrically coupled to the flexible wiring section and a connector electrically coupled to the rigid section and attachable to a computer system for processing data gathered by the sensor.

The method can include manufacturing the flexible wiring section by coupling a first flexible electrical strip to an opposing second flexible strip to define a controlled separation volume between flexible strips for signal integrity and providing a low thermal conductive path during operation. The method can include flexing the flexible wiring section within the housing. The method can include arranging the circuit board, the rigid section, and the connector into an end-launch, in-plane connection configuration such that the sensor output data speed can be at least 2.7 Gbps and can have an operating temperature below 40 Kelvins, for example.

A method of operating a sensor module can include capturing digital imaging data pertaining to objects and transferring such data via an RFA attached to a sensor chip assembly.

FIG. 1 shows an isometric view of a sensor module (focal plane array module) 10 for high-speed data transfer, in accordance with one example. The assembly 10 can include an electrical component 12 (dashed lines) attachable to a sensor chip assembly 14 (such as an infrared or visible focal plane array having p-n junctions and a ROIC). The electrical component 12 can be a circuit board assembly contained within a sensor cover 16 attachable to a sensor module (e.g., FIG. 2), for example, by the pedestal 17. A flexible wiring section 18 can be electrically coupled at a first end 20 to the electrical component 12 for transferring data gathered by the sensor chip assembly 14 and providing power to the SCA. The flexible wiring section 18 can facilitate electrical connectivity while creating a resistive thermal path (i.e., can minimize thermal transfer) for reducing heat conduction along the flexible wiring section 18 (this thermal or heat transfer will be further discussed with reference to FIGS. 3A and 3B). A connector 22 (e.g., FIG. 1) can be electrically coupled to a second end 24 of the flexible wiring section 18. The connector can be attachable to a computer system 50 (e.g., FIG. 2) for processing data gathered by the sensor.

Figure 2:
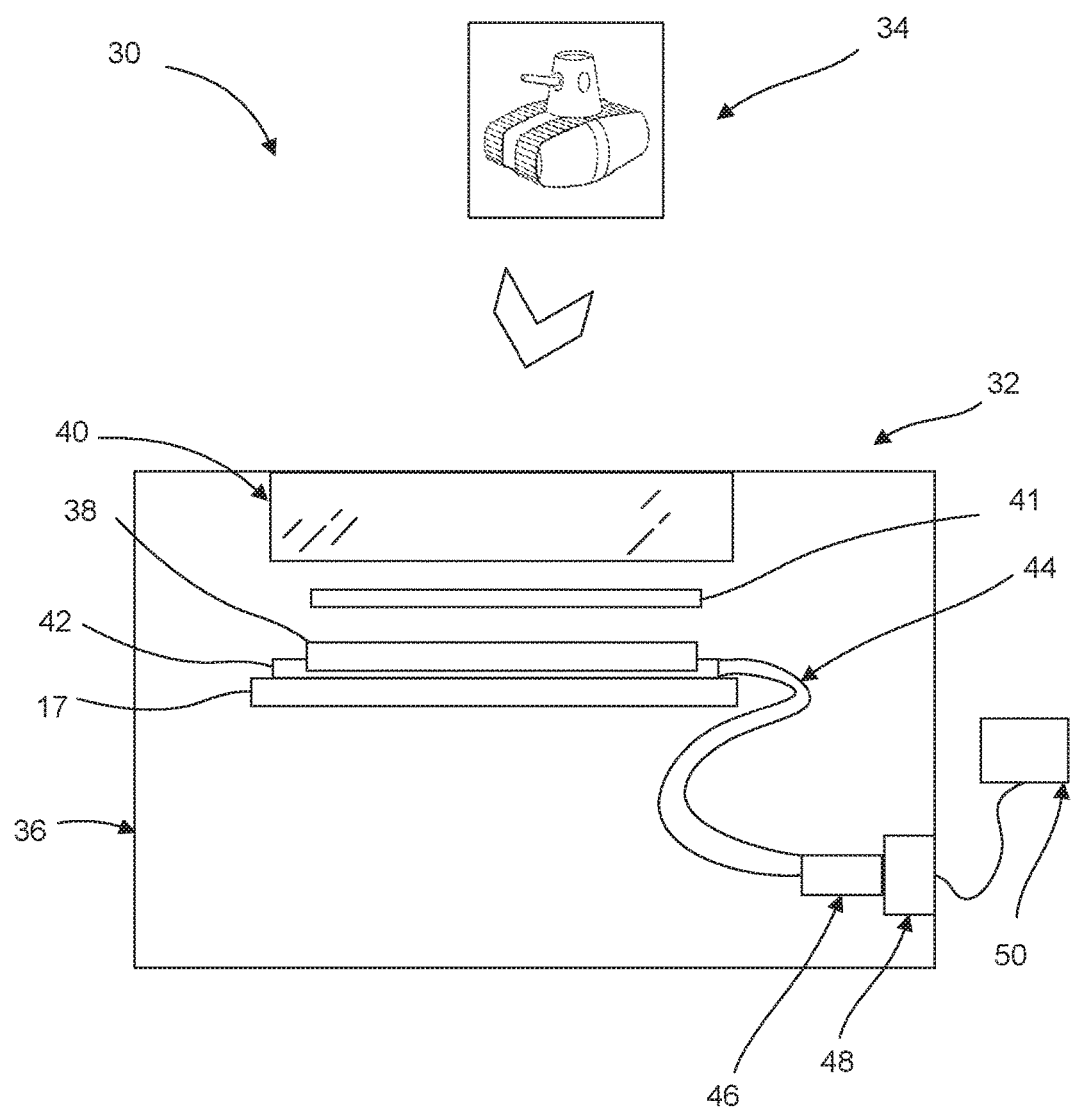
FIG. 2 shows a schematic illustration of a sensor module (Focal Plane Array Module-FPAM) having an RFA, in accordance with an example of the present disclosure.

FIG. 2 shows a schematic of a sensor module system 30, in accordance with one example. The system 30 can include an Integrated Focal Plane Housing Assembly 32 (IFPHA) for capturing images/video of objects 34, for example. The IFPHA 32 can include a housing 36 and a sensor chip assembly 38 within the housing 36. The IFPHA 32 can include a transparent layer 40 (e.g., powered or unpowered glass element) to allow the sensor chip assembly 38 to capture images of objects. An electrical component 42, such as a circuit board or RFA, can be electrically coupled to the sensor 38. A pedestal 17 is attached to the electrical component 42 for attachment to the housing 36. Optionally, a filter 41 may be positioned between the layer 40 and the sensor 38. A flexible wiring section 44 can be electrically coupled to the electrical component 42 for transferring data gathered by the sensor chip assembly 38. The flexible wiring section 44 can be covered or wrapped with a low emissivity material, such as vacuum deposited aluminum on Kapton (or others as recognized by those skilled in the art), which can reduce the thermal loads further while maintaining signal integrity. A rigid or flexible section 46 can be electrically coupled to the flexible wiring section (see e.g., FIGS. 3A and 5). A connector 48, such as a hermetic connector, can be electrically coupled to the rigid or flexible section 46 and attachable to a computer system 50 for processing data gathered by the sensor 38. In some aspects, the housing assembly 32 can comprise one or more seals or sealing means to provide a sealed unit configured to protect the signal chain from environmental conditions.

The flexible wiring section 44 can be capable of high-speed data transfer for optimal signal integrity and for providing a low thermal conductive path. As illustrated in FIG. 2, the flexible wiring section 44 can be flexed (e.g., can serpentine) within the housing 36. Note that the flexible wiring section 44 is a single or multiple flexible wiring section that provides an end-launch from the connector 48 to the electrical component 42 (see example of FIG. 3A). Therefore, the electrical component 42, flexible wiring section 44, rigid section 46, and connector 48 provide an end-launch, in-plane connection configuration for optimized signal integrity for single or multiple flexible sections. In one example configuration, the output data speed of the sensor chip assembly 38 is at least 2.7 Gbps and can operate at a temperature below 40 Kelvins with over 200 thermal cycles.

Figure 3A:
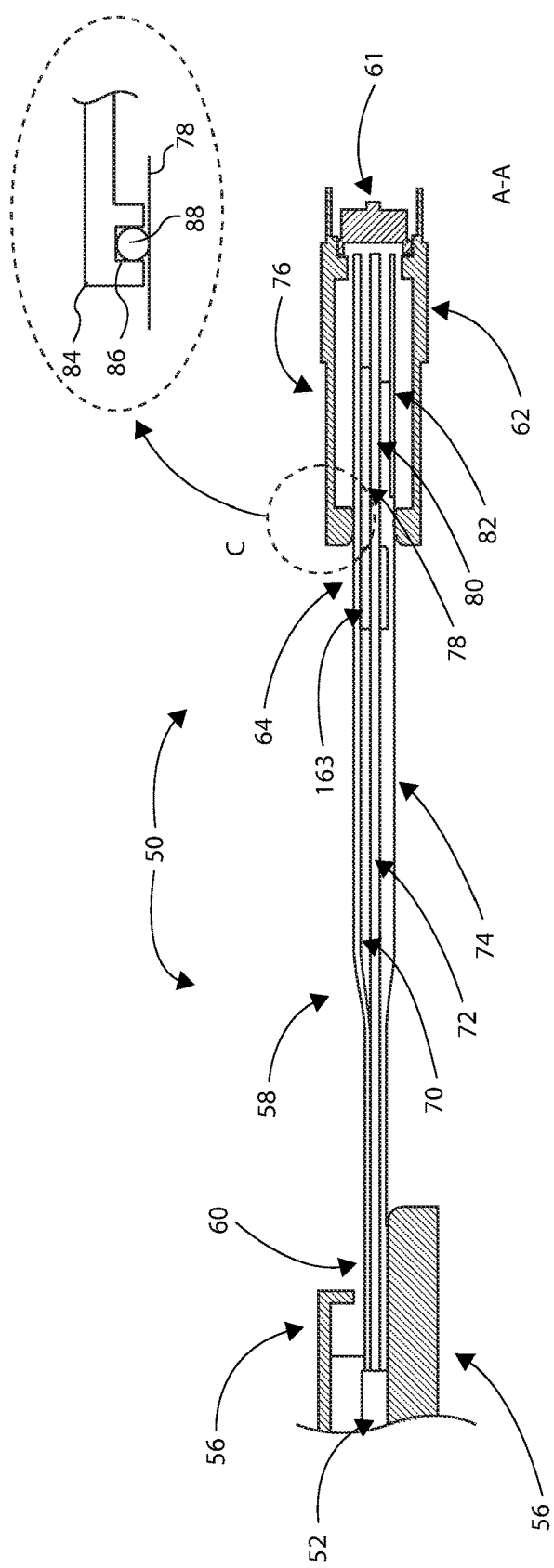
FIG. 3A shows a cross-sectional view of the RFA of FIG. 1.

FIGS. 3A and 3B are different cross sections of the rigid-flex assembly of FIG. 1 taken along different areas. FIG. 3A shows a cross-sectional view about line A-A of the RFA of FIG. 1, and FIG. 3B shows an isometric cross-sectional view about line B-B of the flexible wiring section of FIG. 1. In one example, FIG. 3A discloses an RFA 50 having an electrical component 52 attachable to a sensor chip assembly (not shown here). The electrical component 52 can be a circuit board with power filtering contained within a pedestal 56 attachable to a sensor module (such as the sensor module of FIG. 2). A flexible wiring section 58 can be electrically coupled at a first end 60 to the electrical component 52 for transferring data gathered by the sensor. The flexible wiring section 58 can be configured to reduce or minimize thermal energy transfer from the pedestal to the housing section 58. A connector 61 can be electrically coupled to a second end 64 of the flexible wiring section 58. The connector 61 with the connector backshell 62 can be attachable to a computer system (e.g., FIG. 2) for processing data gathered by the sensor.

In one example, the flexible wiring section 58 can have a first flexible strip 70 that includes a first set of electrical wires or traces, and a second flexible strip 72 that includes a second set of electrical wires or traces that are separated and offset from the first set of electrical wires. As shown in FIG. 3B, the first flexible strip 78 and the second electrical strip 72 are shaped to define a controlled separation volume 73 between the strips to maintain signal integrity and minimize electrical cross talk with acting to reduce the thermal loss (see e.g., FIGS. 4A and 4B). Accordingly, as shown on FIG. 3B the left and right sides of the first flexible strip 78 and of the second electrical strip 72 have thicker edges shown in the cross-sections compared to the thinner middle section of each strip that, when combined or laminated to thicker edge sections of an opposing strip, define the controlled separation volume 73. A third flexible strip 74 can be positioned adjacent the second flexible strip 72 and can transfer electrical power from a power source via the RFA and to a sensor module, for example. The flexible wiring section 58 can comprise a microstrip configuration (e.g., FIG. 4A) or a stripline configuration.

In some examples, the RFA can include a plurality of rigid substrates 76 (e.g., FIGS. 3A, 5, and 7) that are electrically coupled to the second end 64 of the flexible wiring section 58. In one example, the rigid substrates 76 can include an upper substrate 78, a middle substrate 80, and a lower substrate 82 (see e.g., FIG. 5). The upper substrate 78 can be electrically attached to the first flexible strip 70; the middle substrate 80 can be electrically attached to the second flexible strip 72; and the lower substrate 82 can be electrically attached to the third flexible strip 74.

In some examples, the connector 61 can comprise a straddle-mount type connector. The connector 61 can include a plurality of electrical pins (FIGS. 6A, 6B, and 7) that electrically couple the substrates 76 to a computer system, for instance. In some examples, the connector 61 and substrates 76 and RFA are devoid of connecting wires, which improves signal integrity as compared to wire bond connection systems or through-hole connectors, for example. As mentioned above, incorporating this type of connector 61 and connector backshell 62 provide an end-launch connection to the flexible wiring section 58 and the electrical component 52 (i.e., the RFA and connector are devoid of 90 degree turns and connecting wires, for example, which optimizes signal integrity). As shown by cutout C of FIG. 3A, the connector backshell 62 can include an upper connector backshell housing 84 having a slot portion 86 sized to receive a conductive/semi-conductive gasket 88, such as an EMI gasket. The dielectric gasket 88 is compressible against the upper substrate 78. Likewise, a lower connector backshell housing of the connector 62 (opposite the upper housing 84) can include a similar slot portion to receive a conductive/semi-conductive gasket compressible against the lower substrate 82 such that the opposing housings of the connector 62 pinch or compress against the upper and lower substrates as well as between, as required (see FIGS. 5 and 7). The EMI gasket in the upper and lower housings assists to reduce vibration and/or minimize or eliminate electromagnetic interference.

Figure 4A:
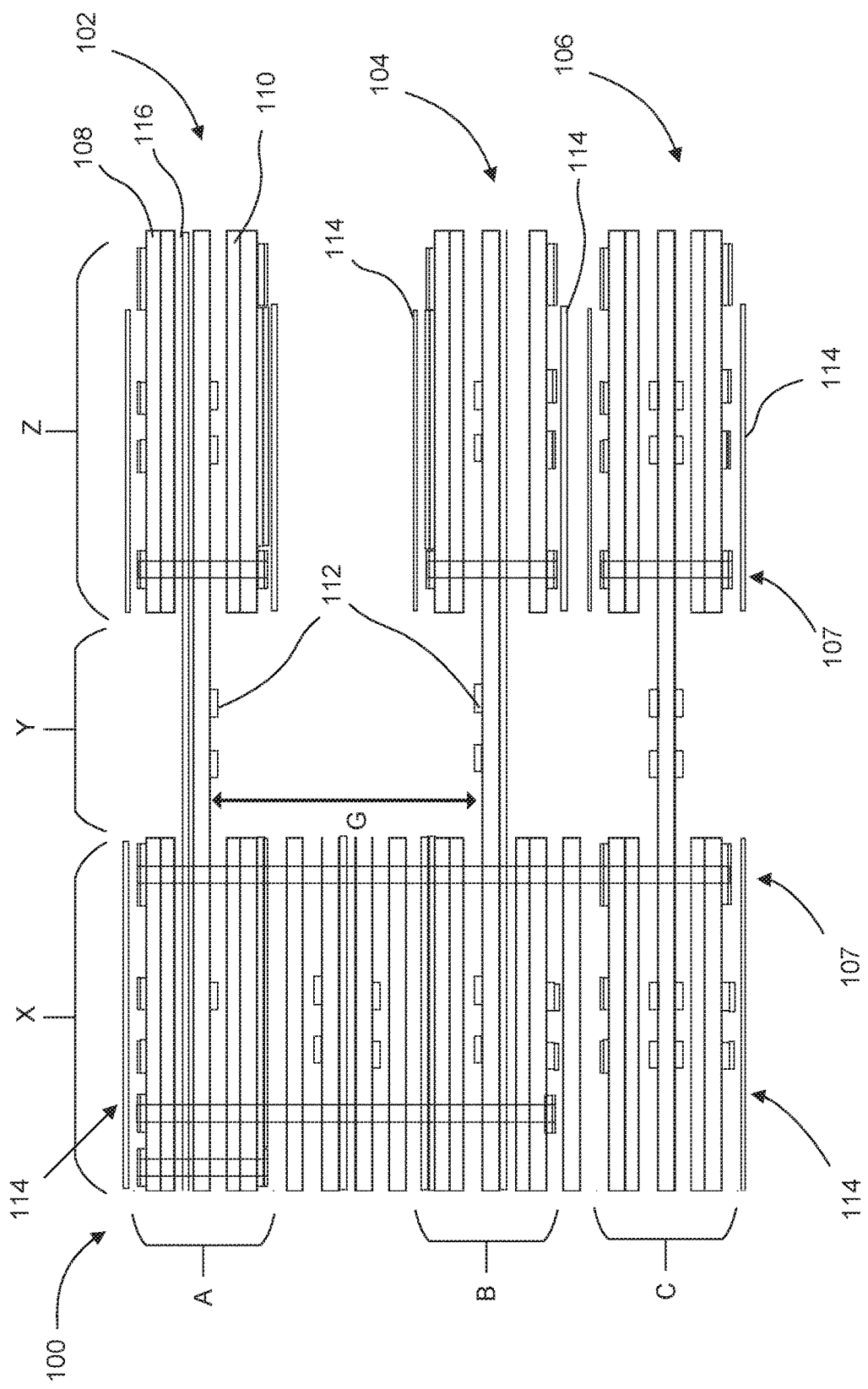
FIG. 4A shows a schematic of a stack of an RFA, in accordance with an example of the present disclosure.

FIG. 4A shows a microstrip stack 100, in accordance with one example. The stack 100 can include a plurality of etched printed flexible boards and can be incorporated as part of the flexible wiring sections discussed in the present application. For example, strip section A can be a first flexible strip 102, strip section B can be a second flexible strip 104, and strip section C can be a third flexible strip 106. Accordingly, section X is an example of a stack section of an electrical component (e.g., an integrated circuit board) discussed in the present application. Section Y can be a stack section of a flexible wiring section discussed in the present application. Section Z can be a stack section of three rigid substrates (e.g., a rigid section) discussed in the present application. Each strip section A, B, C can be manufactured separately and then may be electrically coupled and grounded together by a plurality of vias 107 (blind and thru vias) and maintain spatially separate sections from each other to form the stack sections X, Y, Z. This configuration allows a flexible wiring section to flex within a sensor module, for example, while avoiding electrical contact between wires and to define a controlled separation and reduce the thermal loss to the housing. To this end, the stack configuration of FIG. 4A provides a controlled separation distance/volume G between the first flexible strip 102 and the second flexible strip 104 (see also FIGS. 3B and 4B as examples). The controlled separation between flexible wiring sections can be optimized between signal integrity and reduced thermal loads.

With particular detail of the stack 100 of FIG. 4A, a plurality of dielectric cores 108 and coverlays 110 are included as attachable to the vias 107 allowing the signals to be strategically routed to the connector solder pads. These materials will not be discussed in great detail; however, they can be selected from a type of available layers such as Polyimide, Pyralux®, or other suitable material with low dielectric loss tangent. On the cores 116 is a plurality of copper traces 112 that electrically couple components of an RFA and sensor, for example. The particular configuration of these traces (especially adjacent the controlled separation distance/volume G) will be discussed further with reference to FIGS. 4B and 4C. A plurality of solder masks 114 can be provided as shown on FIG. 4A. In addition, a plurality of ground plates 116 can be provided on sections of the stack as shown. Of particular note, this microstrip configuration for each flex wiring section provides a single-sided ground construction that balances signal integrity with minimal or optimized thermal load, all while maintaining flexibility.

FIGS. 4B and 4C show schematics that illustrate geometries of controlled impedance trace construction for a portion of a flexible wiring section, in accordance with one example. FIG. 4B shows a first flexible section 122 opposing a second flexible section 124 and defining gas(es) or vacuum gap G (such as in FIG. 4A). The first flexible section 122 includes a ground plane 126 and a core 128 having traces 130p and 130n and traces 132p and 132n. Likewise, the second flexible section 124 includes a ground plate 136 and a core 138 having traces 140p and 140n and traces 142p and 142n. Traces having a "p" subscript and "n" subscript can represent the "positive" and "negative" components of a differential trace pair, respectively. In one example, these traces transfer data from the ROIC of the sensor chip assembly such as described with reference to Figures in the present application.

In some examples and with reference to FIG. 4B, distance D1 is a distance between trace 130n and 132p, which can be at least 0.032 inches. Distance D2 is a distance between a centerline of a pair of traces and an opposing, adjacent trace. For instance, a centerline C of traces 130p and 130n is distance D2 from either 140n or 142p, which can be at least 0.016 inches. Thus, a distance ratio between the centerline C of a pair of traces and a trace of an adjacent pair of traces (D2) can be a 2:1 ratio. The controlled separation volume or gap G can be nominally 0.032 inches. Thus, a distance ratio between adjacent pair of traces (D1) and the gap G can be at least a 1:1 ratio. Likewise, a distance ratio between D2 and gap G can be at least a 2:1 ratio. To minimize the unwanted effects of electrical crosstalk between differential pairs, for the microstrip differential pair implementation shown, the minimum distance G and the minimum in-plane pair separation distance D1 should be should be at least 4 times the distance D5. The microstrip configuration eliminates the second opposing signal ground layer for each flexible section for stripline and therefore reduces the thermal conductive load. For a stripline differential pair implementation, the minimum in-plane pair separation distance D1 can be further reduced to minimize unwanted effects of electrical cross talk between differential pairs. This separation and signal trace spacing can optimize the signal integrity and minimize the signal cross talk while acting to reduce or minimize thermal loads. In either the microstrip or stripline differential pair transmission line implementations, the signal trace width and spacing, in-plane pair to pair separation can be optimized between signal integrity and reduced thermal loads.

With continued reference to FIG. 4C, a flexible wiring section 144 includes a ground plane 146 and a core 148. The flexible wiring section 144 includes traces 150p and 150n. A separation distance D3 between traces 150p and 150n can be at least 4 mils. A width distance D4 of either trace 150p or 150n can be at least 3 mils. A height distance D5 of the core 148 (and the distance between ground 146 and a trace 150p and 150n) can be at least 3 mils. Therefore, a distance ratio between D4 and D5 can be at least 1:1 ratio for a 100 Ohm differential impedance implementation. However, other suitable ratios and differential impedances are possible.

Figure 5:
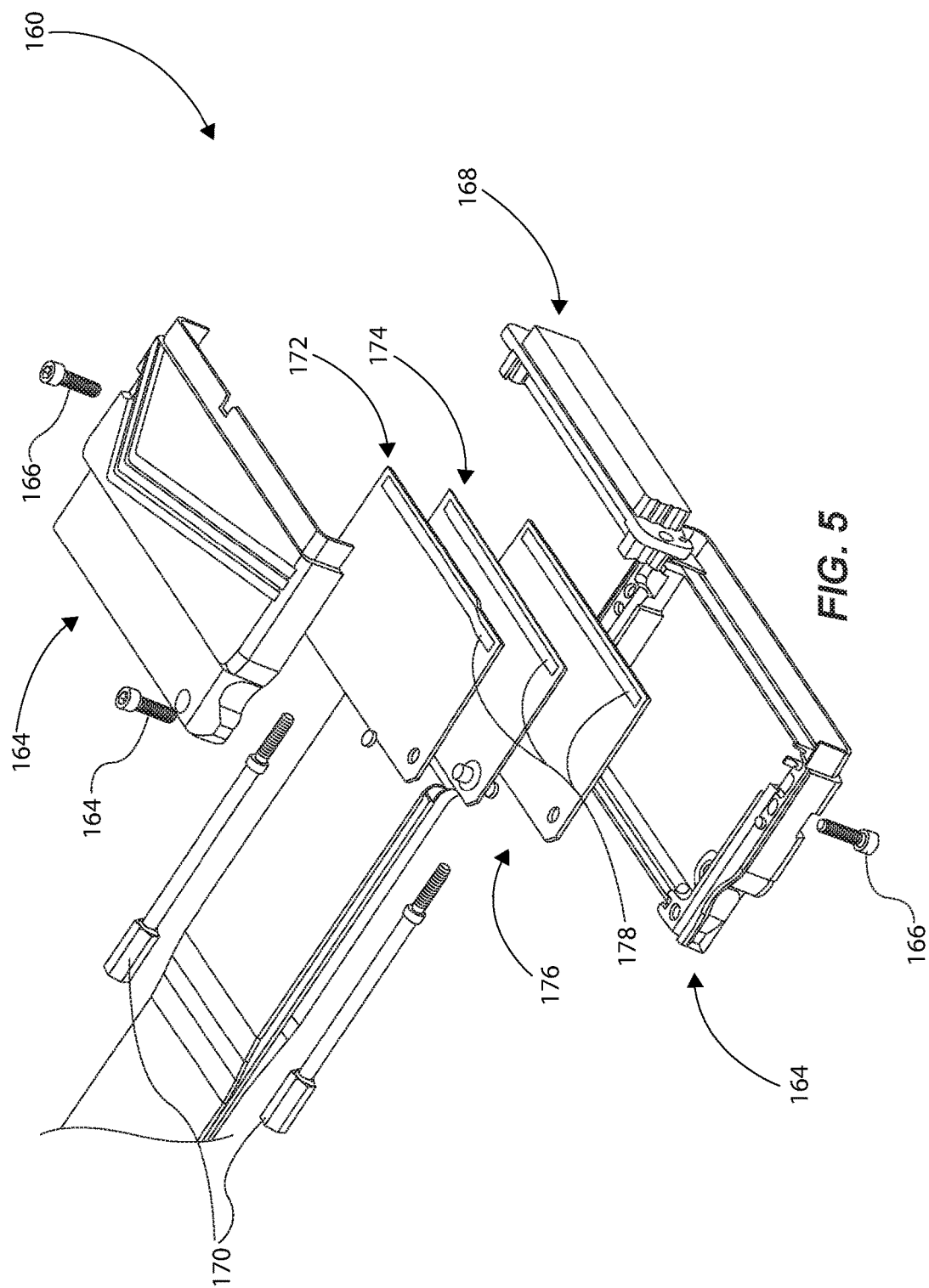
FIG. 5 shows an exploded view of an edge connector of an RFA, in accordance with an example of the present disclosure.

FIG. 5 shows an exploded view of an edge connector assembly 160 of an RFA, in accordance with an example of the present disclosure. Similar to FIG. 3A, the connector assembly 160 may have an upper housing 162 coupled to a lower housing 164 by a plurality of fasteners 166. The housings 162 and 164 may be coupled to a connector frame member 168 by a pair of fasteners 170 (and by other interfacing features). Three substrates 172, 174, and 176 may be spatially separated from each other within the housings 162, 164. Each substrate 172, 174, and 176 may have a plurality of V-pads 178 to receive contacts coupled to the frame member 168. The V-pads 178 may be formed in the upper and lower surfaces of each substrate (FIG. 7).

FIG. 6A shows a top view of a portion of the edge connector of FIG. 5, in accordance with an example of the present disclosure. The connector frame member 168 includes a plurality of contact flexures 180 extending therefrom (see also FIG. 7). A substrate 172, for example, includes a plurality of V-pads 178 to receive the contact flexures 180 and electrically couple each pin to a trace of each V-pad on the substrate. FIG. 6A shows the contact flexures 180 disengaged from the V-pads 178, while FIG. 6B shows the contact flexures 180 engaged to the V-pads 178 to electrically couple the substrate 182 to a computer system, for example. FIGS. 6A and 6B only show a single row of contact flexures and a single row of V-pads on an upper surface of substrate 172 (see FIG. 7 for a view of a full column of pins and V-pads on three substrates). As shown on FIG. 6B, the contact flexures 180 are spatially separated from each other by virtue of being positioned in a respective V-pad 178. As previously discussed, the substrates are electrically connected to the frame member only by these contact flexures, and thus, are devoid of connection wires (e.g., jumper wires).

Figure 7:
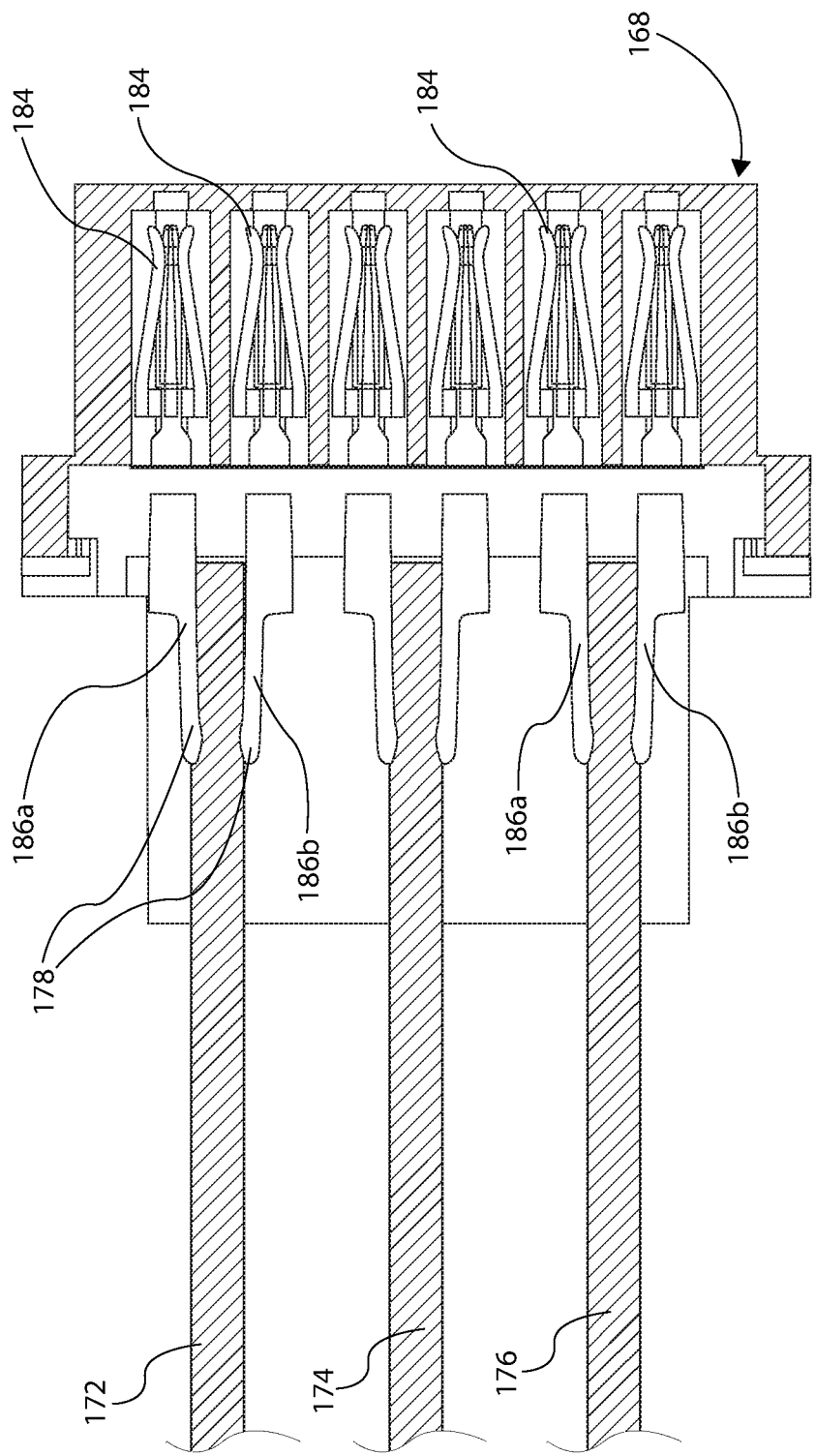
FIG. 7 shows an side cross-sectional view of substrates connected to an edge connector of an RFA, in accordance with an example of the present disclosure.

FIG. 7 shows a side cross-sectional view of substrates 172, 174, and 176 connected to the connector frame member 168 of an edge connector of an RFA, in accordance with an example of the present disclosure. Each substrate 172, 174, and 176 is electrically coupled to ports 184 of the frame member 168 via a plurality of upper pins 186a and plurality of lower pins 186b coupled to either surface of each substrate into respective V-pads 178. Thus, each substrate has V-pads 178 formed on upper and lower surfaces of the substrate to electrically receive respective contact flexures 186a, 186b, while maintaining alignment, for instance, and to spatially separate the pins to avoid undesirable contact between pins, thereby eliminating jumper wire bonds.

Figure 8:
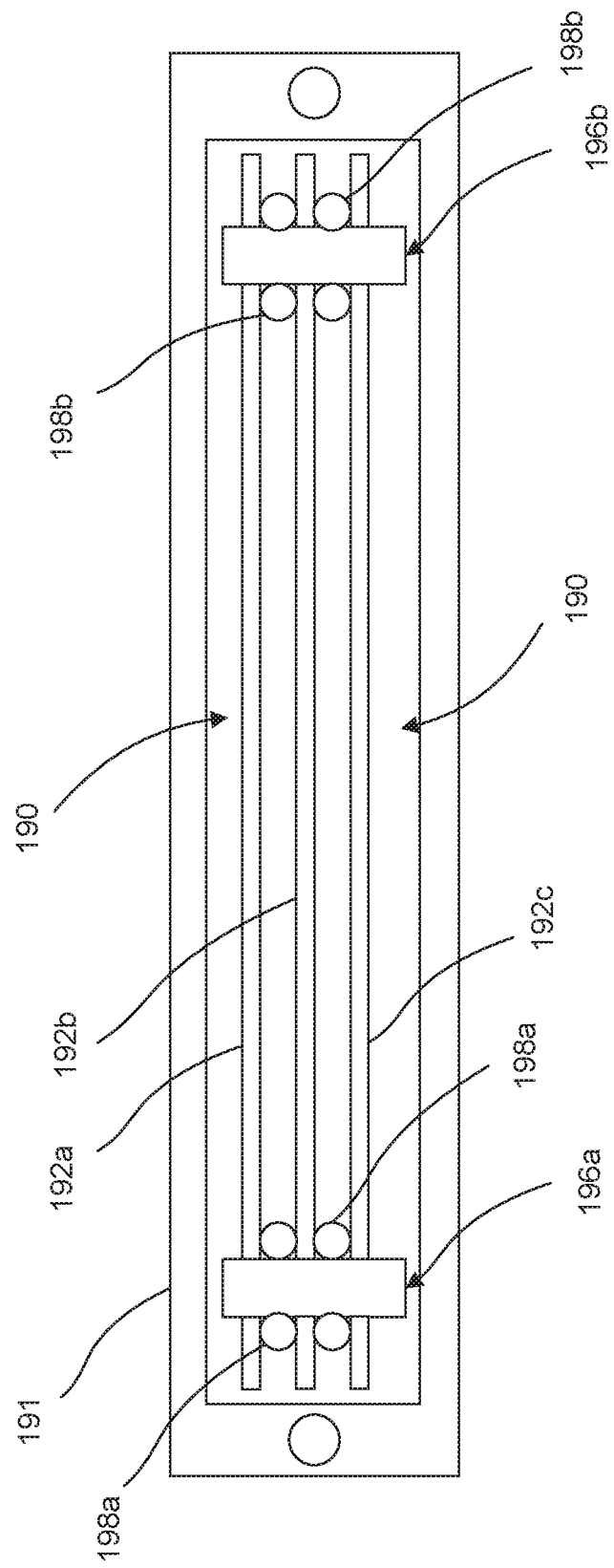
FIG. 8 shows a schematic cross-sectional view of a rigid section of an RFA coupled to a connector, in accordance with an example of the present disclosure.

FIG. 8 is a schematic cross-sectional view of a rigid section 190 attached to a connector assembly 191, in accordance with one example. The rigid section 190 and the connector assembly 191 can be used in the examples discussed with reference to FIGS. 1-4A. The rigid section 190 includes a plurality of substrates, such as a first upper substrate 192a, a second middle substrate 192b, and a third lower substrate 192c. As discussed above, substrate 192a can be electrically coupled to a first flexible strip of a flexible wiring section, and substrate 194b can be electrically coupled to a second flexible strip of the flexible wiring section (e.g., FIGS. 3A and 4A). The substrate 192c can be electrically coupled to a flexible power strip section that is connected to a circuit board and sensor, for instance. The substrates 192a, 192b, and 192c can be spatially separated by a pair of pins/bushings 196a and 196b on the ends of the substrates. The pins/bushings 196a and 196b can each have a pair of dielectric O-rings or elastomers 198a and 198b, respectively. The pins/bushings 196a and 196b assist with providing interconnection strain relief between the substrates (i.e. solder for example) and with providing vibration isolation, thereby improving structural and electrical integrity. Elastomers (not shown) can be positioned between ends of the pins/bushings 196a and 196b and the connector backshell 191 in order to position and insulate the substrates 192a, 192b, and 192c within the connector assembly 191. An elastomeric (e.g., conductive) buffer material (buffer 163 of FIG. 3A) can be positioned between the substrates at the location where the flexible section is coupled to the substrates and enters the connector housing, thereby providing stability and a common ground for reduced EMI susceptibility.

Figure 9:
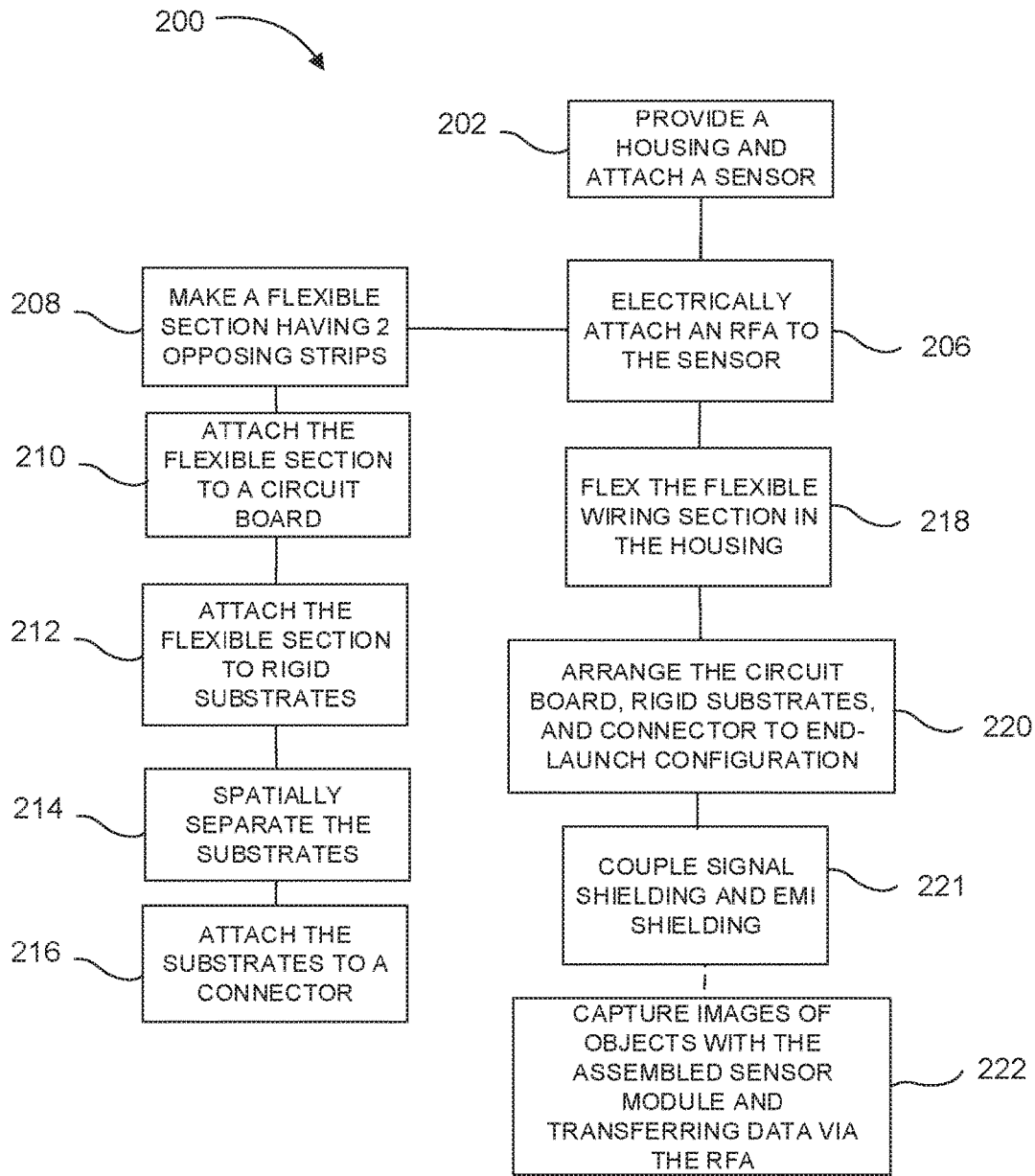
FIG. 9 shows a flow chart of a method for making an RFA for a sensor module, in accordance with an example of the present disclosure.

FIG. 9 is a flow chart of a method 200 of making a high-speed sensor module having an RFA, in accordance with one example. The method can include step 202 of providing a housing and attaching a sensor chip assembly within the housing. The method can include step 206 of electrically attaching an RFA to the sensor chip assembly. The rigid-flex assembly can include an integrated circuit board electrically coupled to the sensor and a flexible wiring section electrically coupled to the circuit board for transferring data gathered by the sensor. The RFA can further include a rigid section electrically coupled to the flexible wiring section and a connector electrically coupled to the rigid section and attachable to a computer system for processing data gathered from the sensor. The flexible wiring section can be capable of high-speed data transfer for optimal signal integrity while providing a low thermal conductive path.

The method can include step 208 of making the flexible wiring section by coupling a first flexible electrical strip to an opposing second flexible strip to define a controlled separation volume between wires. The method can include step 210 of attaching the flexible wiring section to a circuit board, such as by combining or laminating the flexible wiring section to the circuit board. The method can include step 212 of attaching the flexible wiring section to rigid substrates, such as combining or laminating the flexible wiring section to the rigid substrates. The method can include step 214 of spatially separating a plurality of rigid substrates from each other with dielectric bushings. The method can include step 216 of electrically attaching the plurality of rigid substrates to a connector. The bushings provide controlled separation and allow for CTE changes between the connector interface and the backshell. In addition, an EMI gasket can secure between the connector backshell and each of the separate sections to provide EMI attenuation relative to the signals.

After making the RFA, the method can include step 218 of flexing the flexible wiring section within the housing. The method can include step 220 of arranging the circuit board, the rigid section, and the connector into an end-launch, in-plane connection configuration in the sensor housing. The method can include step 221 of coupling or incorporating signal shielding and/or EMI shielding, such as coupling the conductive O-rings, bushings, and/or gaskets further discussed in the present disclosure.

Once assembled, a method step 222 can include using the sensor module by capturing images and/or data with the module and transferring such information via the RFA to a computer system, for example.

It will be appreciated by a person having ordinary skill in the art that the method steps could be accomplished in any particular order to make a sensor module having an end-launch rigid-flex assembly with a single flexible wiring section that is flexed with the sensor module.

It is to be understood that the examples of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular examples only and is not intended to be limiting.

Reference throughout this specification to "one example" or "an example" means that a particular feature, structure, or characteristic described in connection with the example is included in at least one example of the present invention. Thus, appearances of the phrases "in one example" or "in an example" in various places throughout this specification are not necessarily all referring to the same example.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various examples of the present invention can be referred to herein along with alternatives for the various components thereof. It is understood that such examples and alternatives are not to be construed as de facto equivalents of one another, but are to be considered as separate and autonomous representations of the present invention.

Furthermore, the described features, structures, or characteristics can be combined in any suitable manner in one or more examples. In the description, numerous specific details are provided, such as examples of lengths, widths, shapes, etc., to provide a thorough understanding of examples of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A rigid-flex assembly for high-speed data transfer, the assembly comprising:
   a flexible wiring section having a first end and a second end, the first end electrically coupleable to an electrical component for transferring data gathered by a sensor, the flexible wiring section comprising a first flexible strip and a second flexible strip stacked and attached together;
   a controlled separation void between the first and second flexible strips having a gap distance optimized between signal integrity and reduced thermal loads;
   a first set of electrical traces formed on the first flexible strip;
   a second set of electrical traces formed on the second flexible strip, such that the first set of electrical traces oppose the second set of electrical traces about the controlled separation void;
   a first rigid substrate attached to the first flexible strip about the second end of the flexible wiring section, and a second rigid substrate attached to the second flexible strip about the second end of the flexible wiring section, such that the first and second rigid substrates are spatially separated from each other and form a stack; and a connector electrically coupled to the first and second rigid substrates, and attachable to a computer system for processing the data.

2. The assembly of claim 1, wherein the gap distance of the controlled separation void is defined by a distance between sections of the first flexible strip and the second flexible strip of the flexible wiring section.

3. The assembly of claim 1, wherein each of the first and second flexible strips comprises side edge sections that at least partially define the shape of the controlled separation void.

4. The assembly of claim 1, wherein the first set of electrical traces are offset from the second set of electrical traces.

5. The assembly of claim 1, wherein the assembly comprises only a single flexible wiring section coupled to the electrical component such that the electrical component, the first and second rigid substrates, and the connector provides an end-launch, in-plane connection configuration for optimized signal integrity for each signal layer.

6. The assembly of claim 1, further comprising a connector backshell attached to the connector and at least partially supporting the first and second rigid substrates, and further comprising at least one bushing coupled to each of the first and second rigid substrates to facilitate separation of the first and second rigid substrates from each other.

7. The assembly of claim 1, wherein the electrical component is an integrated circuit board assembly, and wherein the sensor comprises a focal plane array module having output data from 1 bps to greater than 2.7 Gbps.

8. The assembly of claim 1, wherein the first and second rigid substrates are spatially separated from each other and are oriented generally parallel relative to each other.

9. The assembly of claim 1, further comprising a third flexible strip stacked and attached to the second flexible strip, wherein at least a section of each of the first, second, and third flexible strips are laminated together, and further comprising a third rigid substrate attached to the third flexible strip.

10. The assembly of claim 1, wherein the flexible wiring section is wrapped or covered with a low emissivity material that reduces thermal loads further while maintaining signal integrity.

11. A sensor module for capturing and transferring data, the assembly comprising:
a housing;
a sensor within the housing;
an integrated circuit board assembly electrically coupled to the sensor;
a flexible wiring section electrically coupled to the circuit board for transferring data gathered by the sensor, the flexible wiring section comprising a first flexible strip and a second flexible strip stacked and attached together, and a controlled separation void between the first and second flexible strips having a gap distance optimized between signal integrity and reduced thermal loads;
a rigid section electrically coupled to the flexible wiring section; and
a connector electrically coupled to the rigid section and attachable to of a computer system for processing data gathered from the sensor, wherein the flexible wiring section is capable of high-speed data transfer.

12. The sensor module of claim 11, wherein the flexible wiring section is flexed within the housing.

13. The sensor module of claim 11, wherein the first flexible strip comprises a first set of electrical wires, wherein the second flexible strip comprises a second set of electrical wires, and wherein the first and second sets of electrical wires oppose each other within the controlled separation void.

14. The sensor module of claim 11, wherein the connector is an edge connector electrically coupled to the rigid section such that the integrated circuit board, the rigid section, and the connector provide an end-launch, in-plane connection configuration for optimized signal integrity.

15. The sensor module of claim 11, wherein the sensor is a focal plane array.

16. The sensor module of claim 15, wherein the output data speed of the focal plane array is from 1 bps to greater than 2.7 Gbps, and wherein the focal plane array operates from 373K to below 40K.

17. The sensor module of claim 11, wherein the connector further comprises a plurality contact flexures, and wherein the rigid section includes at least one rigid substrate having a plurality of V-pads formed in the at least one rigid substrate and electrically coupled to the plurality of contact flexures to guide the installation and position the contact flexures separately from each other.

18. A method of making a high-speed sensor module, the method comprising:
providing a housing;
attaching a sensor within the housing;
electrically attaching a rigid-flex assembly to the sensor, the rigid-flex assembly comprising:
an integrated circuit board electrically coupled to the sensor;
a flexible wiring section electrically coupled to the circuit board for transferring data gathered by the sensor, the flexible wiring section comprising a first flexible strip and a second flexible strip stacked and attached together, and a controlled separation between the first and second flexible strips void having a gap distance optimized between signal integrity and reduced thermal loads;
a rigid section electrically coupled to the flexible wiring section; and
a connector electrically coupled to the rigid section and attachable to of a computer system for processing data gathered by the sensor, wherein flexible wiring section is capable of high-speed data transfer for optimal signal integrity and to minimize thermal loss.

19. The method of claim 18, further comprising flexing the flexible wiring section within the housing.

20. The method of claim 18, further comprising making the flexible wiring section by coupling the first flexible strip to the second flexible strip positioned opposite the first flexible strip, each flexible strip having electrical wiring for transferring data, whereby a section of the first and second flexible strips define the controlled separation void to minimize thermal loss.

21. The method of claim 18, further comprising arranging the integrated circuit board, the rigid section, and the connector into an end-launch, in-plane connection configuration such that the sensor output data speed is from 1 bps to greater than 2.7 Gbps and operates between 373K and below 40K.

22. The method of claim 18, further comprising spatially separating a plurality of rigid substrates of the rigid section from each other, and further comprising electrically attaching the plurality of rigid substrates to the connector with a plurality of contact flexures electrically connected to V-pads disposed on an upper surface and lower surface of each of the rigid substrates.

23. A rigid-flex device, comprising:
 a flexible wiring section having a first end and a second end, the first end electrically coupleable to an electrical component for transferring data gathered by a sensor, the flexible wiring section having a first flexible strip and a second flexible strip stacked and attached together, a separation void and first and second sets of electrical wires opposing each other about the separation void;
 at least one rigid substrate electrically coupled to the second end of the flexible wiring section; and
 a connector electrically coupled to the at least one rigid substrate, the connector configured to be attached to of a computer system for processing the data.

24. The device of claim 23, wherein the flexible wiring section further comprises a plurality of flexible strips, and including the first and second flexible strips, wherein the at least rigid substrate comprises a plurality of rigid substrates each electrically coupled to respective flexible strips.

25. The device of claim 23, wherein the separation void is defined between respective sections of first and second flexible strips of the plurality of flexible strips, wherein the first flexible strip comprises the first set of electrical wires, and the second flexible strip comprises the second set of electrical wires separated from and opposing the first set of electrical wires across from the separation void.

26. The assembly of claim 1, further comprising covering or wrapping the flexible wiring section with a low emissivity material to reduce thermal loads further while maintaining signal integrity.

* * * * *